(12) United States Patent
Trimmer

(10) Patent No.: US 9,310,423 B2
(45) Date of Patent: Apr. 12, 2016

(54) DETECTING OPERATING CONDITIONS

(71) Applicant: STMicroelectronics (R&D) Ltd., Marlow Bucks (GB)

(72) Inventor: Mark Trimmer, Bristol (GB)

(73) Assignee: STMICROELECTRONICS (RESEARCH & DEVELOPMENT) LIMITED, Marlow Bucks (GB)

( * ) Notice: Subject to any disclaimer, the term of this patent is extended or adjusted under 35 U.S.C. 154(b) by 246 days.

(21) Appl. No.: 13/934,786

(22) Filed: Jul. 3, 2013

(65) Prior Publication Data

US 2014/0009168 A1    Jan. 9, 2014

(30) Foreign Application Priority Data

Jul. 6, 2012   (GB) .................................. 1212033.3

(51) Int. Cl.
  *G01R 31/28*    (2006.01)
  *G01R 31/317*   (2006.01)

(52) U.S. Cl.
  CPC ...... *G01R 31/2832* (2013.01); *G01R 31/31725* (2013.01)

(58) Field of Classification Search
  CPC .................................................. G01R 31/2832
  USPC .............................................. 324/555; 327/20
  See application file for complete search history.

(56) References Cited

U.S. PATENT DOCUMENTS

| | | |
|---|---|---|
| 5,890,100 A | 3/1999 | Crayford |
| 6,232,845 B1 | 5/2001 | Kingsley et al. |
| 6,693,449 B1 | 2/2004 | Gorgen |
| 8,531,225 B1 * | 9/2013 | Hussain ........................ 327/276 |
| 2005/0007154 A1 | 1/2005 | Patella et al. |
| 2007/0126409 A1 * | 6/2007 | Cannella ................. H02M 1/38 323/282 |
| 2008/0007272 A1 | 1/2008 | Ferraiolo et al. |
| 2008/0288196 A1 * | 11/2008 | Singh et al. ..................... 702/79 |
| 2009/0055122 A1 | 2/2009 | Singh et al. |
| 2009/0152949 A1 * | 6/2009 | Adragna et al. ................ 307/31 |
| 2010/0327913 A1 * | 12/2010 | Trimmer ......................... 327/20 |
| 2011/0291630 A1 * | 12/2011 | Konstadinidis et al. ...... 323/283 |

* cited by examiner

*Primary Examiner* — Arleen M Vazquez
*Assistant Examiner* — Brent J Andrews
(74) *Attorney, Agent, or Firm* — Allen, Dyer, Doppelt, Milbrath & Gilchrist, P.A.

(57) ABSTRACT

An apparatus may include a delay line having a first delay value corresponding to first operating conditions of the apparatus and a second delay value corresponding to second operating conditions of the apparatus. A monitoring circuit may monitor a time taken for a first clock edge of a clock signal to propagate through the delay line. A determining circuit may determine whether operating conditions of the apparatus are acceptable in response to the time taken.

22 Claims, 9 Drawing Sheets

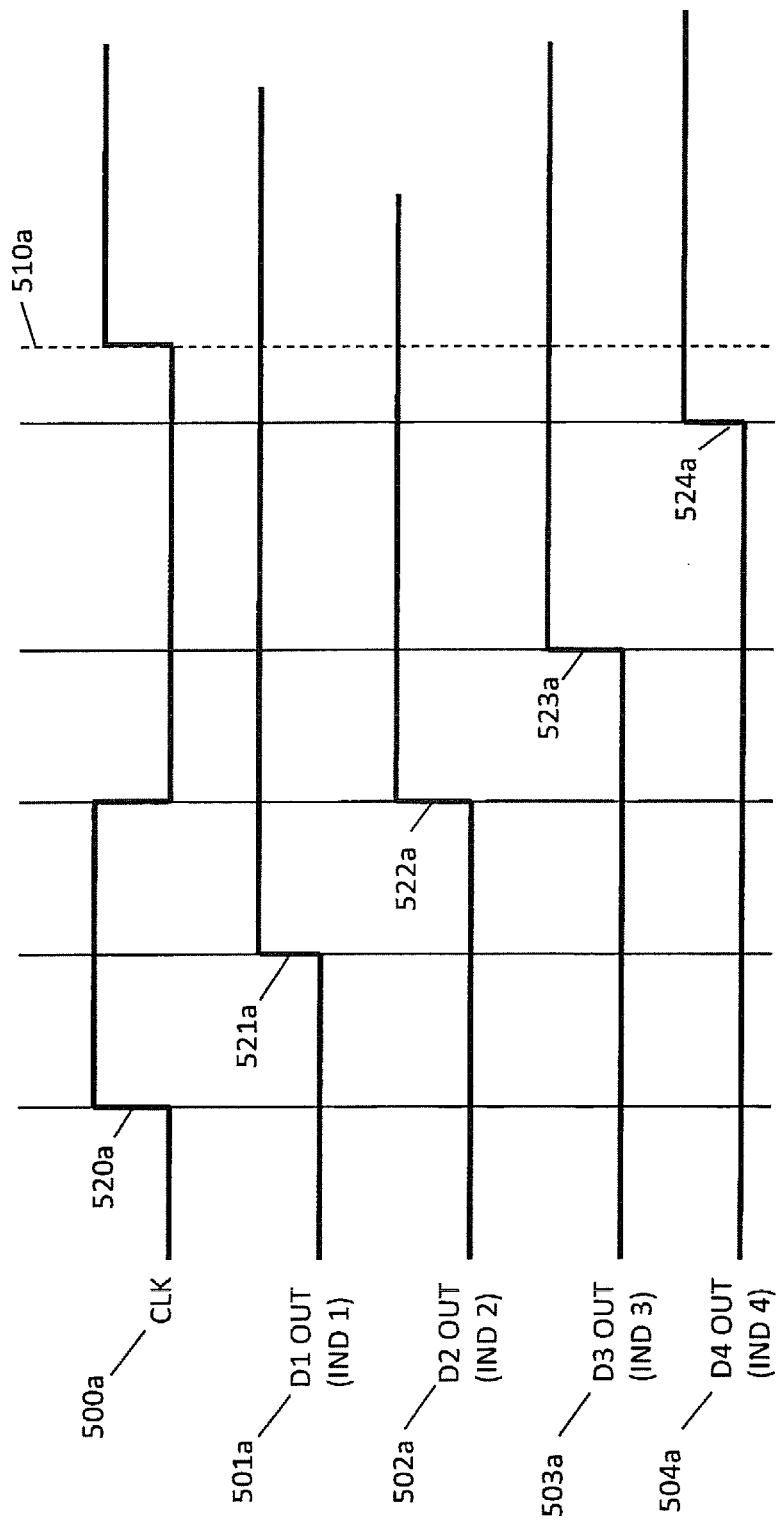

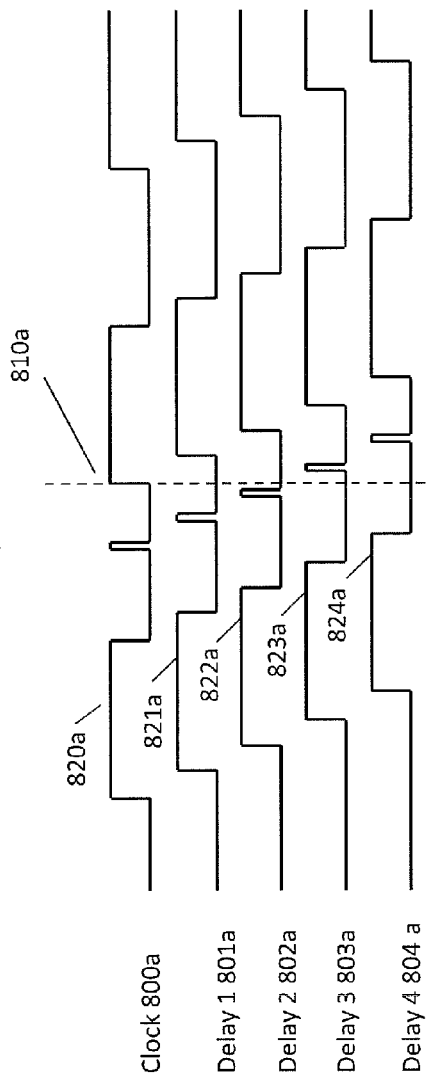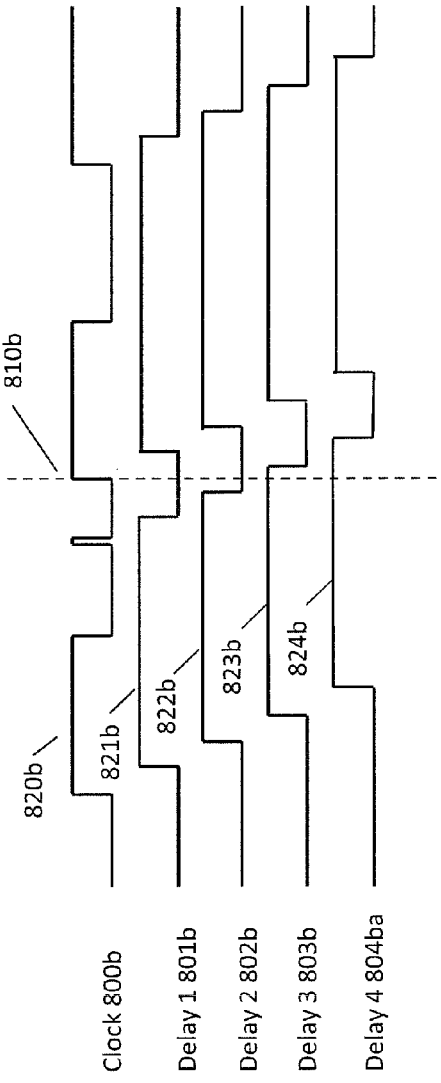

though operation of circuit elements or components of a circuit may be influenced by the operating conditions of the circuit. Operating conditions may comprise, for example, a temperature of the circuit, a voltage supplied to a circuit and/or an age of circuit components.

DETECTING OPERATING CONDITIONS

TECHNICAL FIELD

The present application relates to determining operating conditions of a circuit, and more particularly, to determining whether operating conditions are acceptable for the operation of the circuit.

BACKGROUND

The operation of circuit elements or components of a circuit may be influenced by the operating conditions of the circuit. Operating conditions may comprise, for example, a temperature of the circuit, a voltage supplied to a circuit and/or an age of circuit components.

The operating conditions of a circuit may affect the function of circuit components, for example, the operating speed of components. In order to allow a circuit to operate at a desired clock frequency, circuits are often designed to operate as close to failure as possible. While this has advantages in the speed at which a circuit is clocked, it may reduce the range of operating conditions under which the circuit can function without error.

While circuits may be designed to operate correctly in worst-case operating conditions, it can be difficult to predict how circuit components will behave under certain conditions. For example, small differences in the fabrication of circuits and materials used may influence the behavior of components under certain operating conditions. For example, even circuits from an identical fabrication batch may behave differently under the same operating conditions. It therefore may not be possible to accurately predict how a circuit component will behave under all operating conditions.

SUMMARY

According to a first aspect, an apparatus may comprise a delay line having at least a first delay value corresponding to first operating conditions of the apparatus and at least a second delay value corresponding to second operating conditions of the apparatus, a monitoring circuit for monitoring a time taken for a first clock edge of a clock signal to propagate through the delay line, and a determining circuit for determining whether operating conditions of the apparatus are acceptable in response to the time taken. The delay line may comprise a plurality of delay elements. The monitoring circuit may be configured to provide an indication of an output value of each delay element.

More specifically, the determining circuit may determine if the clock edge has propagated through the delay line within a threshold time period. The threshold time period may correspond to an acceptable delay of the delay line. The threshold time period may be a clock period of the clock signal. The determining circuit may be configured to determine the output values of the delay elements at a second clock edge and compare the output values.

The determining circuit may be configured to determine that the operating conditions of the apparatus are acceptable when the output values of the delay elements indicate that a clock edge has propagated through the delay elements. The determining circuit may be configured to determine that the operating conditions of the apparatus are acceptable when the output values of the delay elements are the same.

In some embodiments, the monitoring circuit may comprise a first plurality of flip-flops. The output value of each delay element may be configured to clock a respective one of the first plurality of flip-flops. The monitoring circuit may further comprise a second plurality of flip-flops, each of the second plurality of flip-flops may be configured to receive a respective output from each of the first plurality of flip-flops. The apparatus may further comprise an inverter at the input of at least one of the second plurality of flip-flops and an inverter at the output of the at least one of the second plurality of flip-flops. The determining circuit may further comprise a combination circuit configured to provide an indication having a first value when output values of the plurality of flip-flops are the same and a second value when the output values of the flip-flops are different.

The apparatus may be associated with a circuit and the delay of the delay line may be indicative of a speed of operation of circuit elements of the associated circuit. The acceptable delay may be indicative of a speed of operation of the circuit elements for which the associated circuit operates without error.

According to another aspect, a method may comprise delaying a first clock edge by a first delay value under first operating conditions of an apparatus and by a second delay value under second operating conditions of the apparatus, and monitoring a time taken for the first clock edge of a clock signal to propagate through the delay line. The method may include determining whether operating conditions of the apparatus are acceptable in response to the time taken.

The delaying may comprise propagating the first clock edge through a plurality of delay elements. The monitoring of the time taken may further comprise providing an indication of an output value of each delay element. The determining may further comprise determining if the first clock edge has propagated through the delay elements within a threshold time period. The threshold time period may correspond to an acceptable time for the first clock edge to propagate through the delay elements. The threshold time period may comprise a clock period of the clock signal.

The method may further comprise determining the output values of the delay elements at a second clock edge and comparing the output values. The method may further comprise determining that the operating conditions of the apparatus are acceptable when the output values of the delay elements indicate that a clock edge has propagated through the delay elements. The method may further comprise determining that the operating conditions of the apparatus are acceptable when the output values of the delay elements are the same.

The method may further comprise clocking a respective one of a plurality of first flip-flops with the indication of the output value of each delay element. The method may further comprise receiving a respective output from each of the first plurality of flip-flops at each of a second plurality of flip-flops. The method may further comprise inverting an input value and an output value of at least one of the second plurality of flip-flops. The method may further comprise providing an indication having a first value when output values of the second plurality of flip-flops are the same and a second value when the output values of the flip-flops are different.

According to another aspect, a system may include a functional circuit, and a detector. The detector may include a delay line having at least a first delay value corresponding to first operating conditions of the apparatus and at least a second delay value corresponding to second operating conditions of the apparatus, a monitoring circuit for monitoring a time taken for a first clock edge of a clock signal to propagate through the delay line, and a determining circuit for determining whether operating conditions of the apparatus are acceptable in response to the time taken. The delay of the delay line may be indicative of a speed of operation of circuit elements of the functional circuit.

BRIEF DESCRIPTION OF THE DRAWINGS

Embodiments will now be described with reference to the following figures in which:

FIG. 5a and FIG. 5b are signal diagrams of the operation of some embodiments.

FIGS. 8a and 8b are signal diagrams of the operation of some embodiments of the detector.

DETAILED DESCRIPTION OF THE PREFERRED EMBODIMENTS

Some embodiments may provide a detector for detecting whether circuit components will operate without error under current operating conditions. In some embodiments, a detector may be provided in conjunction with a functional circuit to detect whether the operating conditions of the circuit are acceptable. In other words, the detector may detect whether the functional circuit will operate correctly under the current operating conditions.

Figure 1:
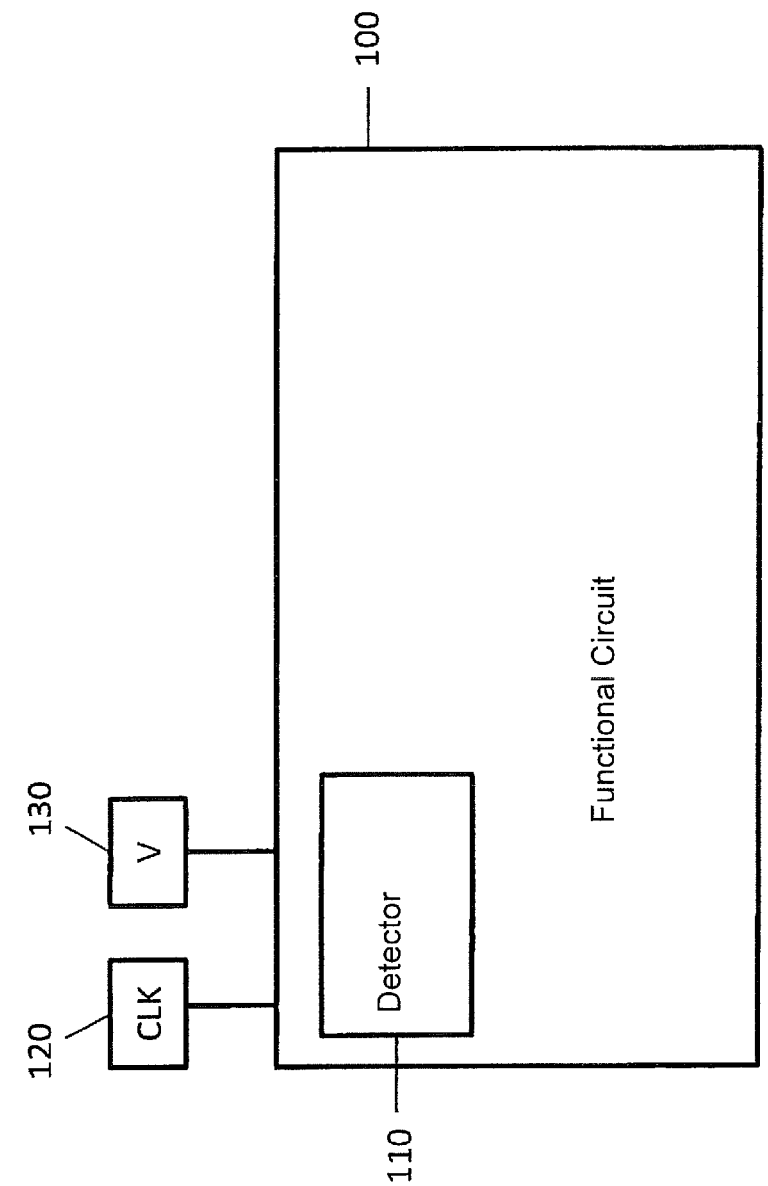
FIG. 1 is a schematic diagram of an embodiment of a system.

FIG. 1 shows an example of a system in which some embodiments may be implemented. FIG. 1 shows a functional circuit 100. It will be appreciated that the functional circuit 100 may include a variety of circuit components carrying out the functionality of circuit.

For example, in some embodiments, the functional circuit 100 may be implemented in a security block for a system, for example, in a set top box. However, it will be appreciated that this is by way of example only and embodiments may be implemented in conjunction with any circuit or system to determine whether the operating conditions are appropriate.

The functional circuit 100 may also include a detector 110. It will be appreciated that the detector 110 may form part of the functional circuit 100 or may be provided as separate circuitry. In some embodiments, the detector 110 and functional circuit 100 form part of a single integrated circuit. In some embodiments, the detector 110 and functional circuit may form a single integrated circuit die. In some embodiments, the functional circuit 100 and detector 110 may be fabricated during a same fabrication process from the same materials. In these embodiments, the shared fabrication may allow a more accurate prediction of the behavior of the functional circuit 100 by the detector circuit 110.

The functional circuit 100 and detector circuit 110 may be provided with a clock signal from a clock 120 and power from voltage supply 130. The clock 120 may be any suitable oscillator or timing source and may be a crystal oscillator in some embodiments. It will be appreciated that while the clock 120 and voltage supply 130 have been depicted as being separate to the functional circuit 100 and detector 110, in some embodiments, the clock 120 and voltage source 130 may form part of the functional circuit 100.

The detector 110 of FIG. 1 may be provided with a clock signal and power from the same clock 120 and voltage supply 130 as the functional circuit 100. In some embodiments, the detector circuit 110 may be subject to the same power and temperature conditions as the functional circuit 100.

Figure 2:
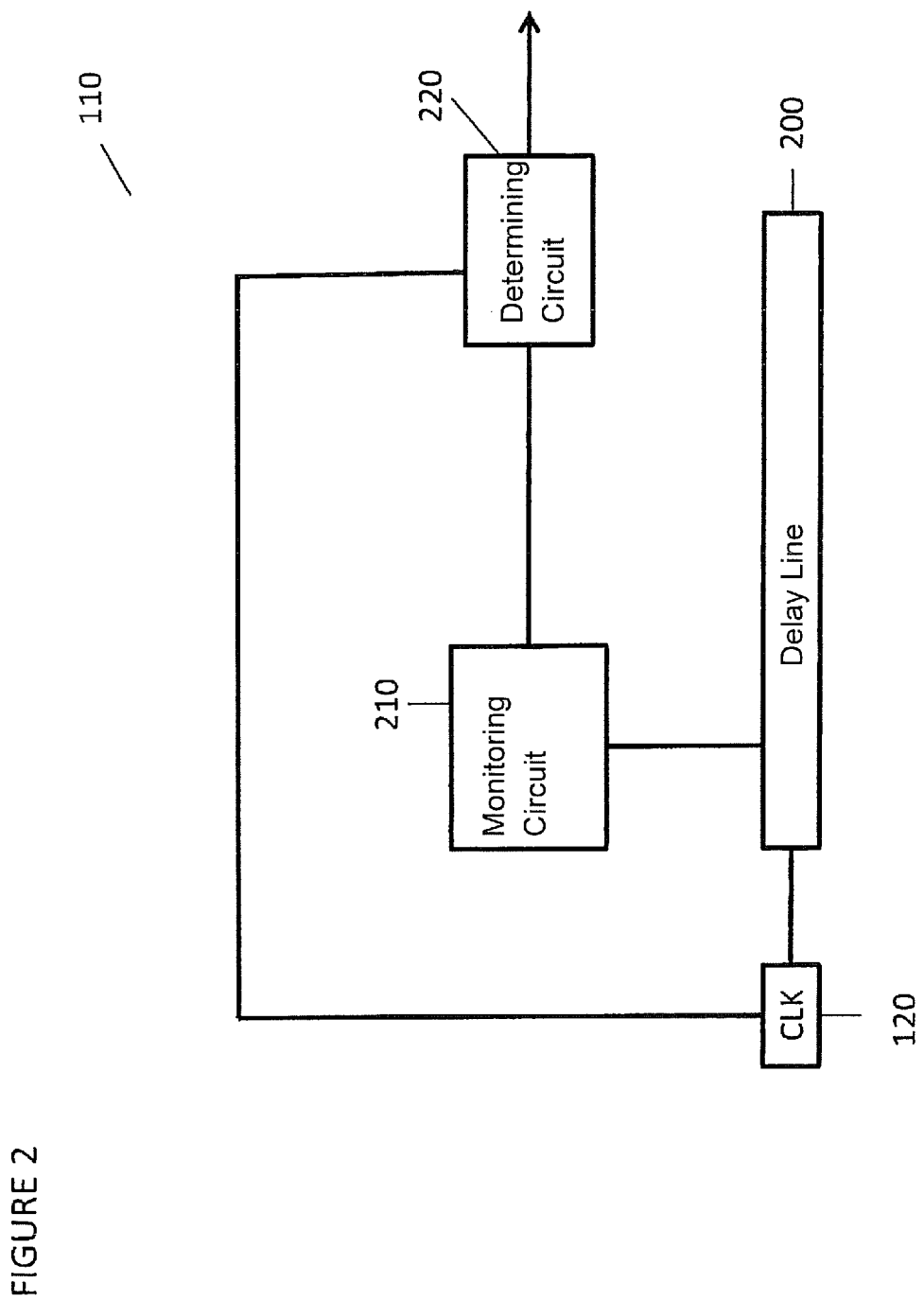
FIG. 2 is a schematic diagram of an embodiment of a detector.

FIG. 2 shows an example of the detector 110. FIG. 2 has been depicted with clock 120 as part of the detector circuit 110, however it will be appreciated that a clock signal may be supplied to the detector circuit externally to the detector circuit 110. The detector circuit 110 comprises the clock 120, a delay line 200, a monitoring circuit 210, and a determining circuit 220. The clock 120 may provide a clock signal to the delay line 200 and to the determining circuit 220. The monitoring circuit 210 may be coupled to the delay line 200.

In some embodiments, the delay line 200 may be made up of circuit elements that provide delay functionality for the delay line 200. As the detecting circuit 110 may be subject to similar operating conditions as the functional circuit 100, the circuit elements of the delay line 200 may be affected and function in accordance with the operating conditions. In some embodiments, the operating conditions may affect the operation of the circuit elements such that a delay of the delay line 200 increases and decreases in response to variations in the operating conditions. For example, the delay line may incur the first delay under first operating conditions and a second delay under second operating conditions.

In some embodiments, the clock signal is propagated through the delay line 200. The time taken for the clock to propagate through the delay line 200 may vary as the operating conditions vary due to the influence of the operating conditions on the operation of the elements making up the delay line 200. The monitoring circuit 210 may monitor the time taken for a clock signal, for example, a clock edge of the clock signal, to propagate through the delay line 200. The monitoring circuit 210 may provide an indication of the time taken for the clock signal to propagate through the delay line to the determining circuit 220, and the determining circuit 220 may determine whether that time taken represents an acceptable operation, for example, speed of operation, of the circuit elements. In other words, it may be determined whether the current operating conditions of the circuit are influencing the operation of the circuit elements such that they operate in error or potentially in error.

Some embodiments may determine whether the clock signal propagates through the delay in less than a threshold time period. The threshold time period may correspond to an expected amount of time for the clock signal to propagate through the delay line 200 under acceptable operating conditions. The threshold time period may in some embodiments be based on a clock period of the clock signal. For example, the threshold time period may correspond to a single, multiple of or fraction of a clock period of the clock signal. The threshold time may in other embodiments be set by a counter or other timing mechanism.

In some embodiments, the monitoring circuit 210 may provide an indication of how far a clock signal has propagated through the delay line to the determining circuit 220. The determining circuit 220 may carry out a determination at the end of the threshold clock period as to whether the clock signal has propagated through the delay line 200. In some embodiments, a determination may also be based on how far through the delay line 200 the clock signal has propagated. For example, some embodiments may determine how close the operating conditions are to being unacceptable based on how far through the delay line 200 the clock signal has propagated.

Figure 3:
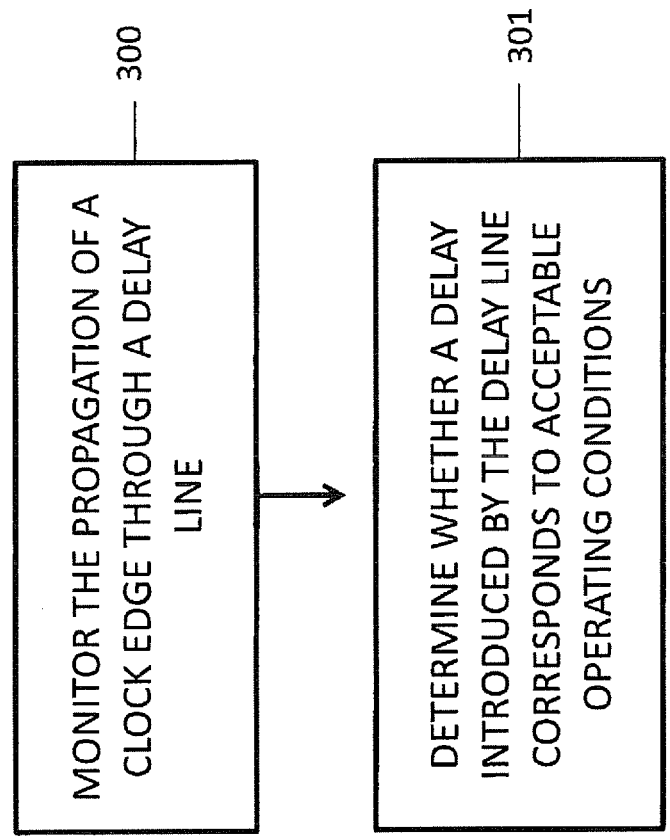
FIG. 3 is a flowchart of method steps in some embodiments.

FIG. 3 shows an example of the method steps that may be carried out by some embodiments. At step 300, the monitoring circuit monitors the propagation of a clock signal through the delay line 200. An indication of this propagation may be provided to the determining circuit 220. At step 220, the determining circuit may determine whether the delay introduced by the delay line 200 corresponds to an acceptable operation of the circuit elements, which in turn corresponds to acceptable operating conditions. For example, if a delay introduced by the delay line 200 is greater than the threshold time period, it may be determined that the circuit elements of the functional circuit 100 are operating too slowly and may be prone to errors.

Figure 4:
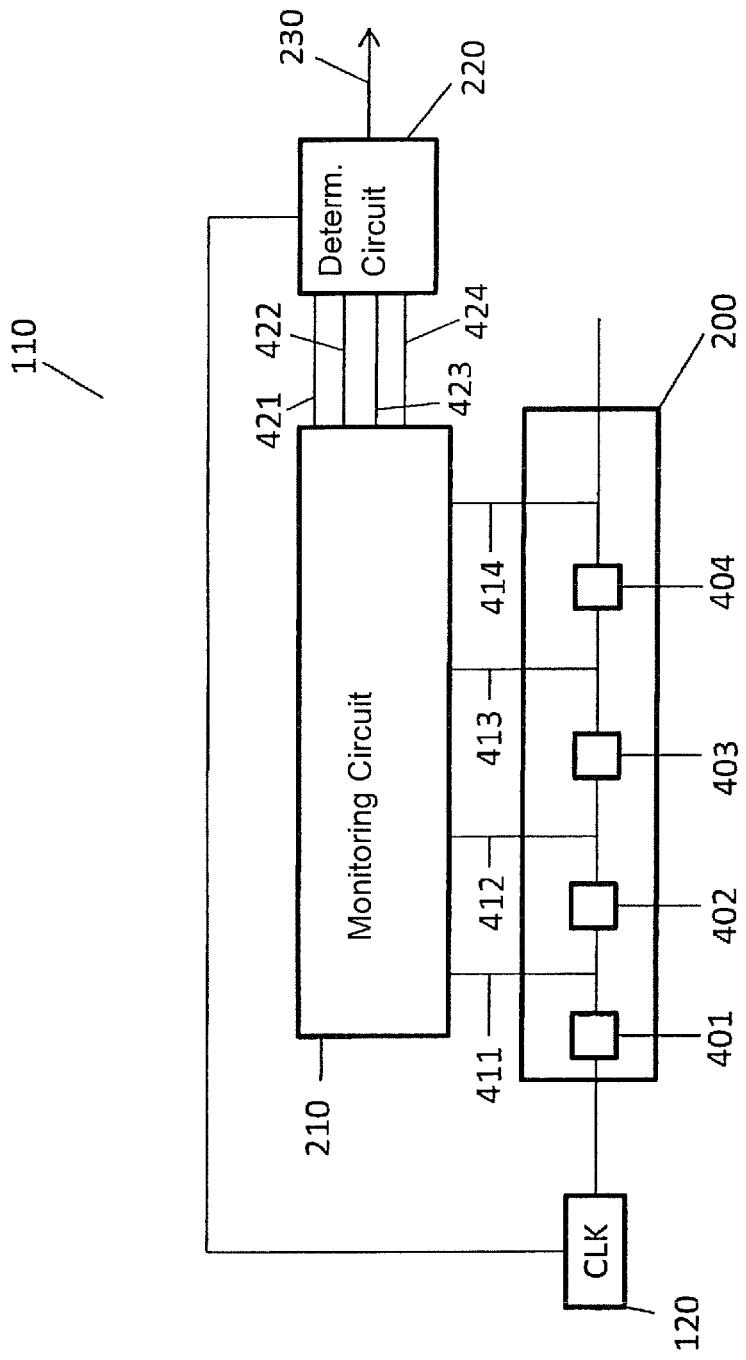
FIG. 4 is a schematic diagram of another embodiment of the detector.

FIG. 4 shows another embodiment of the detector 110. The detector 110 comprises a delay line 200, a clock 120, a monitoring circuit 210, and a determining circuit 220. It will be appreciated that the clock 120, the delay line 200, the monitoring circuit 210, and the determining circuit 220 may be similar to those described in relation to FIG. 2.

The delay line 200 may comprise a first delay element 401, a second delay element 402, a third delay element 403, and a fourth delay element 404. The delay line 200 may also be coupled to receive a clock signal from the clock 120. It will be appreciated that this is by way of example only, and the delay line may comprise two or more delay elements.

The monitoring circuit 210 may be coupled to receive an output of the first delay element 401 at a first line 411, the output of the second delay element 402 at a second line 412, an output of the third delay element 403 at a third line 413, and an output of the fourth delay element 404 at a fourth line 414. The monitoring circuit 210 may additionally provide a first indication 421, a second indication 422, a third indication 423, and a fourth indication 424 to the determining circuit 220. The determining circuit 220 may be clocked by a clock signal received from the clock 120. The determining circuit may further provide an indication 230.

In operation, the clock 120 may provide a clock signal to the delay line 200. The delay line 200 may propagate an edge of the clock signal through the first, second, third, and fourth delay elements 401, 402, 403, 404. The monitoring circuit 210 may monitor this propagation of the clock edge.

An indication that the clock edge has propagated through the first delay 401 may be provided via line 411, an indication that the clock edge has propagated through the second delay element 402 may be provided via line 412, an indication that the clock edge has propagated through the third delay line 403 may be provided via line 413, and an indication that the clock edge has propagated through the fourth delay 404 may be provided via line 414. In this manner, the monitoring circuit 210 may be aware of how far through the delay line 200 the clock edge has propagated.

The monitoring circuitry 210 may provide an indication that the clock edge has propagated through the first delay element 401 at the first indication line 421. Similarly, the monitoring circuit 210 may provide an indication that the clock edge has propagated through the second delay element 402 at the second indication line 422, an indication that the clock edge has propagated through the third delay element 403 at the third indication line 423, and an indication that the clock edge has propagated through the fourth delay element 404 through the fourth indication line 424.

The determining circuit 220 may receive the first, second, third, and fourth indications 421, 422, 423, 424 and determine how far, at a time determined by the threshold time period, the clock edge has propagated through the delay line 200. In some embodiments, the threshold time period may be set such that the delay of the delay line is less than the threshold time period under acceptable operating conditions.

For example, in some embodiments, the delay incurred by the delay line 200 under acceptable operating conditions may be designed to be just less than a clock period. If a first clock edge of the clock, for example, a rising edge, can be propagated through the delay line 200 within the threshold time period, the determining circuit 220 may determine that the operating conditions are acceptable. If the first clock edge does not propagate through the delay line 200 within the threshold time period, it may be determined that the circuit elements are susceptible to error.

In some embodiments, the first clock edge may be a rising edge and the threshold time period may be from the first clock edge to the next rising clock edge. In other embodiments, the first clock edge may be a falling edge. It will be appreciated that this is by way of example only, and that the propagated edge may be a rising edge or a falling edge. Alternatively, the delay line and threshold clock period may be based on a multiple of the clock period or a portion thereof. In these embodiments, the threshold time period may be from a rising edge to falling edge or falling edge to rising edge, for example. It will be appreciated that this is by way of example only, and the time at which the determination made by the determining circuitry 220 made may be determined in any suitable manner.

Figure 5B:
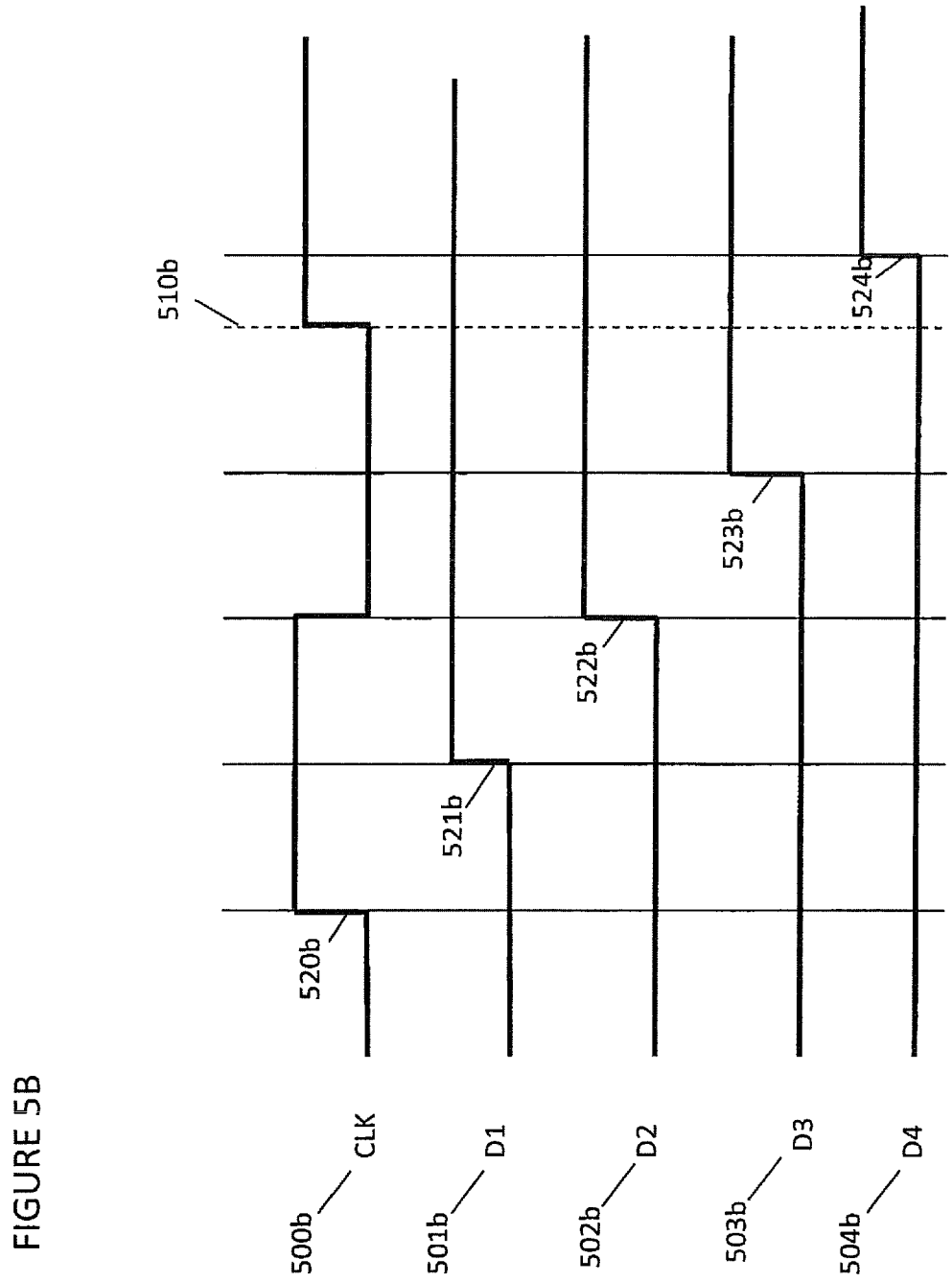

FIGS. 5a and 5b are signal timing diagrams showing an example operation of the detector. FIG. 5a shows an example where the operating conditions of the circuit are such that the delay incurred by the delay line 200 is less than the threshold time period. FIG. 5a includes a clock signal 500a. It will be appreciated that the clock signal 500a may be received from the clock 120. FIG. 5a includes a first signal 501a corresponding to a signal on the first indication line 421, a second signal 502a corresponding to a signal on the second indication line 422, a third signal 503a corresponding to a signal on the third indication line 423, and a fourth signal 504a corresponding to a signal on the fourth indication line 424. It will be appreciated that in the embodiment of FIG. 5a, it is assumed that the monitoring circuit 210 includes only a negligible amount of delay, and that the first, second, third, and fourth signals 501a, 502a, 503a, 504a may also correspond to signals on the first, second, third, and fourth lines 411, 412, 413, 414.

In the embodiment of FIG. 5a, the threshold time period is considered to be a clock period of a clock signal 500a. In this embodiment, a first rising edge of the clock signal is propagated through the delay line, and the determination by the determining circuit 220 is triggered by the next rising edge of the clock signal 500a. It will be appreciated that the threshold time period may defined differently, and the determination made by the determining circuit 220 may be made at a different time. The time at which the determination is made is shown at time 510a.

At time 520a, a first rising edge of the clock signal 500a is entered into the delay line 200. The first delay element 401 may delay the first clock edge for a first delay, and the clock edge is output from the first delay element 401 at a time 521a. At the time depicted by 521a, the first line 411 may indicate to the monitoring circuit 210 that the first clock edge has propagated through the first delay element 401. The first indication 421 may also indicate to the determining circuit 220 that the first clock edge has propagated through the first delay element 401.

The first clock edge may then enter the second delay element 402. The first clock edge may be delayed by the second delay element 402 and output from the second delay element 402 at time 522a. At 522a, the second line 412 and the second indication 422 may indicate that the first clock edge has been output from the second delay element 402.

The first clock edge may then enter the third delay element 403. The first clock edge may be delayed by the third delay element 403 before being output at time 523a. The third line 413 and the third indication 423 may indicate that the first clock edge has propagated through the third delay element 403.

The first clock edge may then enter the fourth delay element 404 and be output from the fourth delay element 404 at time 524a. The fourth line 414 and the fourth indication 424 may indicate that the first clock edge has been output from the fourth delay element 404.

The determining circuit 220 may receive the second rising clock edge of the undelayed clock signal at time 510a. This may trigger the determining circuit to carry out a determination of the propagation of the clock edge through the delay line 200 at the second clock edge at 510a. The determining circuit 220 may determine whether the clock edge has propagated through the entire delay line 200.

In some embodiments, the determining circuit 220 may determine whether the clock edge has propagated through the delay line 200 by determining whether signal values of the first, second, third, and fourth indication lines 421, 422, 423, 424 are the same. In other embodiments, the determining circuit 220 may determine whether values on the first to fourth indication lines 421, 422, 423, 424 correspond to values indicating that the clock edge has propagated through the respective delay element. For example, a high value on the first and second indication lines 421 and 422 may indicate that the clock edge has been output from the first and second delay elements 401, 402, while a low value on the third and fourth indication lines 423, 424 may indicate that the clock edge has been output from the third and fourth delay elements 403, 404. It will be appreciated that this is by way of example only and any combination of values on the indication lines 421-424 may indicate that the clock edge has propagated through the respective delay elements. It may be determined whether the values on the indication lines 421-424 correspond to a pattern of the values indication that the clock edge has propagated through the delay elements.

If it is determined that the signal values of the first, second, third, fourth indication lines 421, 422, 423, 424 correspond to values indicating that a clock edge has propagated through the respective delay elements 401, 402, 403, 404, the determining circuit 220 may determine that the circuit is operating correctly under the current operating conditions. FIG. 5b shows an example where the operating conditions are such that the clock signal takes longer than a threshold time period to propagate through the delay line 200.

Similarly to FIG. 5a, FIG. 5b shows a clock signal 500b, a first signal 501b corresponding to a signal on the first indication line 421, a second signal 502b corresponding to a signal on the second indication line 422, a third signal 503b corresponding to a signal on the third indication line 423, and a fourth signal 504b corresponding to a signal on the fourth indication line 424. It will appreciate be appreciated that in the embodiment of FIG. 5b, it is assumed that the monitoring circuit 210 includes only a negligible amount of delay, and that the first, second, third, and fourth signals 501b, 502b, 503b, 504b may also correspond to signals on the first, second, third, and fourth lines 411, 412, 413, 414.

In the embodiment of FIG. 5b, similarly to that of FIG. 5a, the threshold time period is considered to be a clock period of a clock signal 500b. In this embodiment, a first rising edge of the clock signal propagates through the delay line, and the determination by the determining circuit 220 is triggered by the next rising edge of the clock signal 500b. It will be appreciated that the threshold time period may defined differently, and the determination made by the determining circuit 220 may be made at a different time. The time at which the determination is made is shown at time 510b.

At time 520b, a first rising edge of the clock signal 500b is entered into the delay line 200. The first delay element 401 may delay the first clock edge for a first delay, and the clock edge is output from the first delay element 401 at a time 521b. At the time depicted by 521b, the first line 411 may indicate to the monitoring circuit 210 that the first clock edge has propagated through the first delay element 401. The first indication 421 may also indicate to the determining circuit 220 that the first clock edge has propagated through the first delay element 401.

The first clock edge may then enter the second delay element 402. The first clock edge may be delayed by the second delay element 402 and output from the second delay element 402 at time 522b. At 522b, the second line 412 and the second indication 422 may indicate that the first clock edge has been output from the second delay element 402.

The first clock edge may then enter the third delay element 403. The first clock edge may be delayed by the third delay element 403 before being output at time 523b. The third line 413 and the third indication 423 may indicate that the first clock edge has propagated through the third delay element 403.

The first clock edge may then enter the fourth delay element 404 and output from the fourth delay element 404 at time 524b. The fourth line 414 and the fourth indication 424 may indicate that the first clock edge has been output from the fourth delay element 404.

The determining circuit 220 may receive the second rising clock edge of the undelayed clock signal at time 510b. This may trigger the determining circuit to carry out a determination of the propagation of the clock edge through the delay line 200 at the second clock edge at 510b. The determining circuit 220 may determine whether the clock edge has propagated through the entire delay line 200. In some embodiments, the determining circuit 220 may do this by determining whether signal values of the first, second, third, and fourth indication lines 422, 421, 423, 424 correspond to values indicating that the clock edge has propagated through the respective delay elements 401, 402, 403, 404. In some embodiments, it may be determined whether the values on the indication the lines 421, 422, 423, 424 are the same.

As can be seen from FIG. 5b, the delay of the first, second, third, and fourth delay elements 401, 402, 403, 404 are such that the clock edge is output from the fourth delay element 404 after the time 510b, at which the determination of the propagation of the clock edge is made. This increase in the delays provided by the delay elements may be due to the operating conditions, for example, a low supply voltage and/or a high-temperature.

The determining circuit 220 may determine that, while the first, second, and third 421, 422 and 423 indications indicate that the clock edge has been propagated through the corresponding delay elements, the fourth indication 424 indicates that the clock edge has not yet propagated through the fourth delay element at time 510b. In this case, the determining circuit 220 may indicate that the functional circuit 100 may not be operating correctly under the current operating conditions.

Figure 6:
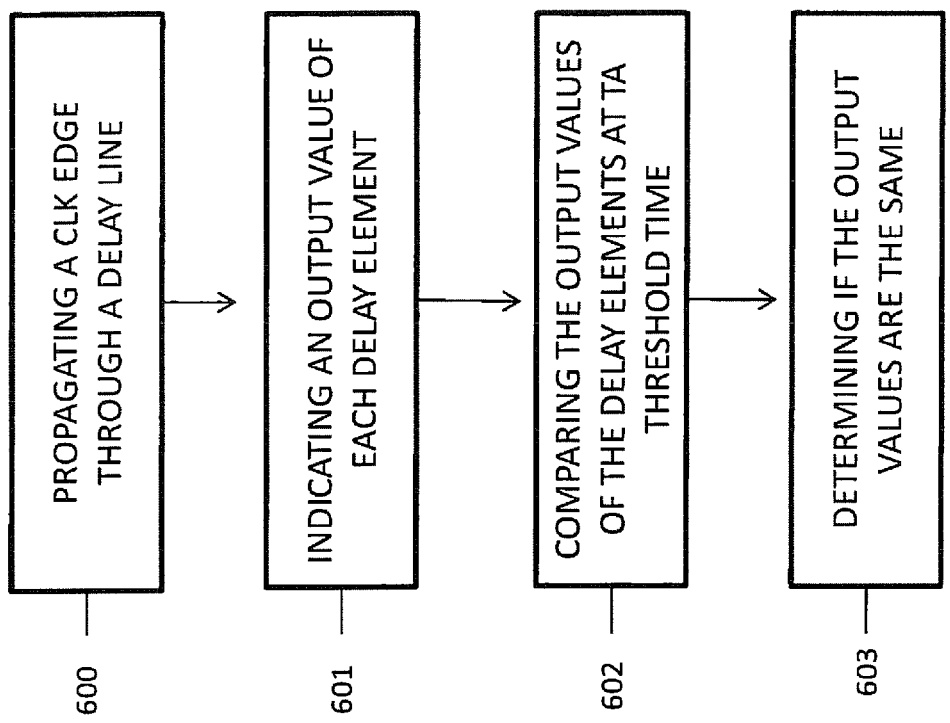
FIG. 6 is a flowchart of steps carried out by some embodiments.

FIG. 6 shows an example of the method steps carried out by embodiments such as that shown in FIG. 4. At step 600 of FIG. 6, a clock edge enters into a delay line 200. The method then progresses to step 601 where an output value of each delay element is indicated to the monitoring circuit 210. This can be seen, for example, in FIGS. 5a and 5b with the first, second, third, and fourth signals 501a/b, 502a/b, 503a/b, 504a/b indicating when a clock edge propagates through the associated delay element.

At step 602, the output values of each delay element 401, 402, 403, 404 are compared at the end of the threshold time period. In some embodiments, this threshold time period may be measured from a first clock edge on a clock signal 500a/b and may correspond to just less than a clock period. It will be appreciated that alternatively, the threshold time may be measured by a timer or other mechanism. In some embodiments, the threshold time period may be measured from a rising edge to rising edge, and/or from a falling edge to falling edge.

The method then progresses to step 603, where it is determined if the output values of each delay element indicate that the clock edge has propagated through that respective delay element. For example, in FIG. 5a, at the time of the determination 510a, the values indicate that a clock edge has propagated through all the delay elements and it can be determined that a clock edge has propagated through the delay line 200 within the threshold time period. If on the other hand, as in FIG. 5b, some values indicate that the clock edge has not yet propagated through the respective delay element, it can be determined that the delay incurred by the delay elements of the delay line 200 are such that the clock edge cannot propagate through the delay line 200 within the threshold time period. It may be determined from this that the operating conditions unacceptable.

Figure 7:
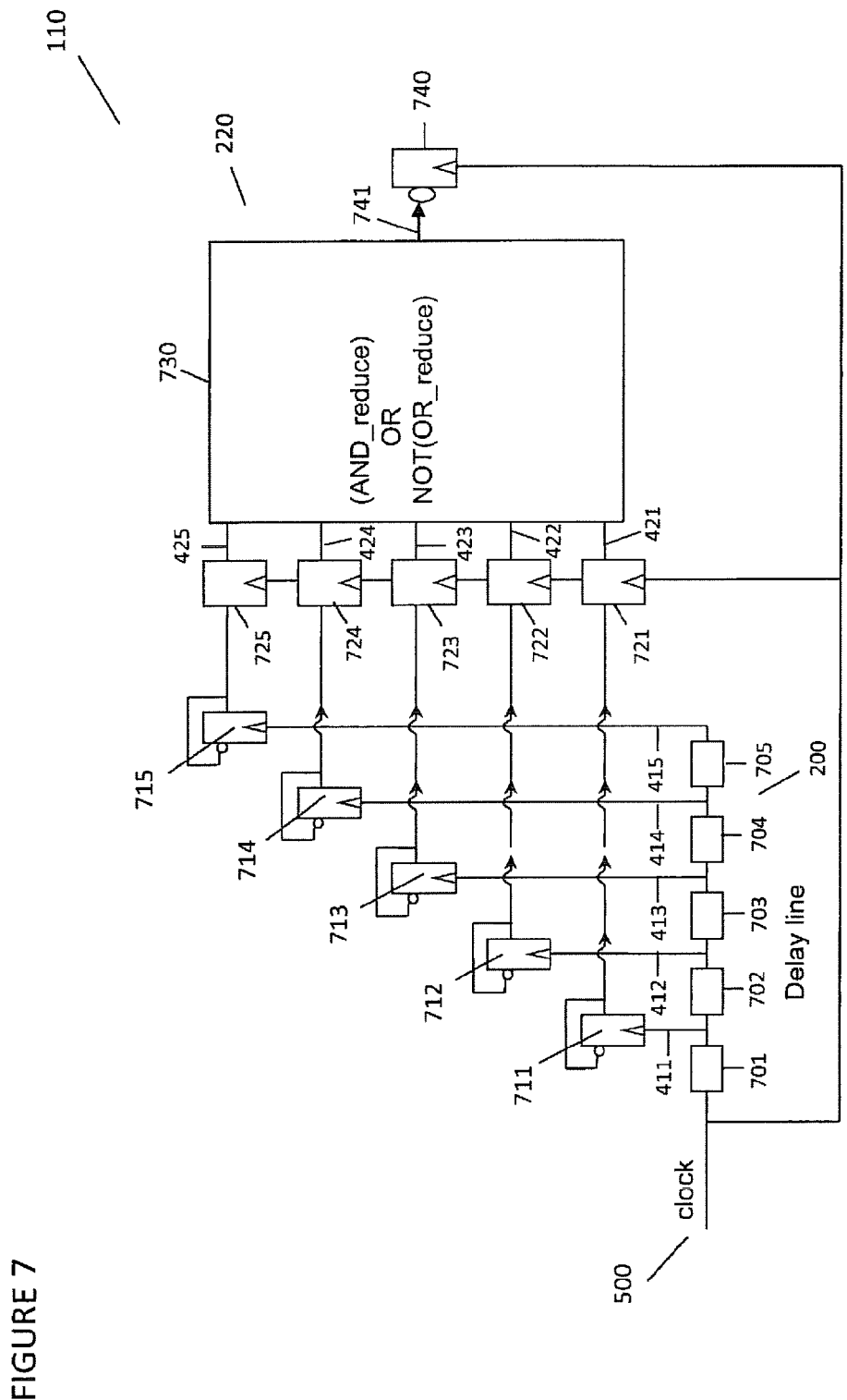
FIG. 7 is a schematic diagram of an example of circuitry implementing some embodiments.

FIG. 7 shows an example of circuitry of a detecting circuit 110. The detecting circuit 110 of FIG. 7 comprises a delay line 200, monitoring circuitry 210, determining circuitry 220, and the detecting circuit receives a clock signal 500. It will be appreciated that the delay line 200, monitoring circuitry 210, and the determining circuitry 220 may be similar to those of FIGS. 2 and 4. It will also be appreciated that the clock signal 500 may be similar to the clock signals 500a, 500b of FIGS. 5a and 5b.

The delay line 200 of FIG. 7 may comprise a first delay element 701, a second delay element 702, a third delay element 703, a fourth delay element 704, and a fifth delay element 705. The first delay element 701 may receive the clock signal 500 and provide an output to the second delay element. An output of the second delay element 702 may be coupled to the input of the third delay element 703. The output of the third delay element 703 may be coupled to an input of the fourth delay element 704. An output of the fourth delay element 704 may be coupled to an input of the fifth delay element 705.

The monitoring circuit 210 may comprise a first flip-flop 711, a second flip-flop 712, a third flip-flop 713, a fourth flip-flop 714, and a fifth flip-flop 75. The first flip-flop 711 may be clocked by the output of the first delay element 701, the second flip-flop 712 may be clocked by the output of the second delay element 702, the third flip-flop 713 may be clocked by the output of the third delay element 703, the fourth flip-flop 714 may be clocked by the output of the fourth delay element 704, and the fifth flip-flop may be clocked by the output of the fifth delay element 705. A data input of each of the flip-flops may be provided by an inverted data output of that flip-flop (i.e. each first flip-flop has a data input, and a data output, the data output being coupled in feedback with the data input).

The data output of the first flip-flop 711 may be provided to a sixth flip-flop 721. The data output of the second flip-flop 712 may be provided to an input of a seventh flip-flop 722. The data output of the third flip-flop 713 may be provided to the data input of an eighth flip-flop 723. The data output of the fourth flip-flop 714 may be provided to an input of a ninth flip-flop 724. The data output of the fifth flip-flop 715 may be provided to an input of a tenth flip-flop 725. The sixth to tenth flip-flops 721 to 725 may be clocked by the undelayed clock signal 500.

The sixth flip-flop 721 may provide the first indication 421 to the determining circuitry 220. Similarly the seventh flip-flop 722, eighth flip-flop 723, ninth flip-flop 724 and tenth flip-flop 725 may respectively provide the second indication 422, third indication 423, fourth indication 424, and fifth indication 425 to the determining circuitry 220. In particular, the first, second, third, fourth, and fifth indications 421, 422, 423, 424 and 425 may be provided to a reducing circuit 730.

The reducing circuit 730 may combine the first to fifth indications 421, 422, 423, 424, 425 into a reduced indication 741. The reduced indication 741 may indicate whether the first to fifth indications 421, 422, 423, 424 and 425 are the same or different.

For example, the reducing circuit 730 may comprise logic circuitry corresponding to (AND and reduce) or NOT (OR and reduce) circuitry. The reduced indication 741 may be inverted and provided as an input to a determining flip-flop 740. The determining flip-flop 740 may be clocked by the undelayed clock signal 500 and may provide an output corresponding to the reduce signal 741 and indicating whether the first to fifth indications are the same and that the operating conditions are acceptable or that the first to fifth indications are different that the operating conditions are not acceptable. It will be appreciated that the sixth to tenth flip-flops 721-725 may be optional and may be implemented when the reducing circuit 730 introduces a delay.

In another embodiment, inverters may be included at the input and output of at least one but not all of the seventh to tenth flip-flops. For example, an inverter may be included at either side of the tenth flip-flop 725. In this case, if the system voltage is so low that the sixth to tenth flip-flops 721 to 725 output a low value regardless of the input value, the detecting circuit 110 will indicate that the operating conditions are not acceptable.

For example, under acceptable operating conditions, the sixth to ninth flip-flops will output a high value. The inverter at the input of the tenth flip-flop 725 will invert the received high value, and the tenth flip-flop 725 will output a low value. A second inverter at the output of the tenth flip-flop 725 will invert the output low value, and a high value will be provided on the fifth indication line 425. In the case where the system voltage is very low, the sixth to ninth flip-flops 721-724 will output a low value regardless of their input value. The output of the tenth flip-flop 725 will also be low regardless of input value, and the low output of the tenth flip-flop 725 will be inverted by the second inverter to provide a high value. In this manner, at least one of the indication lines will output a high value.

In some embodiments, inverters are included for at least one indication line having a first delay that is longer than a delay of at least one indication line without the inverters. This is so that the values on the indication lines 421-425 when the system voltage is very low, differ from the values on the indication lines 421-425 when a clock edge only partly propagates through the delay line 200.

In some embodiments, the determining circuit 220 may determine whether a clock glitch has occurred. A clock glitch can be considered an undesirable clock transition (or multiple transitions) which can cause circuitry to perform unpredictably and it is therefore desirable to detect them. A sudden short clock cycle (a pair of undesirable transitions) is functionally equivalent to operating conditions temporarily getting suddenly worse for a few clock cycles. Therefore, in some embodiments, a sudden short clock cycle may cause the determining circuit 220 to determine that the operating conditions are unacceptable.

Since, in some embodiments, the first to fifth flip-flops 711 to 715 are clocked by the output of the first to fifth delay elements 701 to 705 respectively, the determining circuit 220 may be able to detect extremely short clock glitches. FIG. 8a shows a signal diagram of the operation of a method of detecting operating conditions that does not use flip-flops, which are clocked by a delayed clock signal. At time 810a, the flip-flops are sampled and the delay signals 801a, 802a, 803a and 804a are all low. The circuit is therefore unable to detect the glitch in the clock signal 820a.

FIG. 8b shows a signal diagram of the operation of some embodiments. At time 810b, the flip-flops are sampled. This time the delay signals 801b and 802b are both low and 803b and 804b are both high. The determining circuit 220 may be able to detect the clock glitch.

It will also be appreciated that while five flip-flops 711-715 have been described for capturing the output of the delay elements, two or more flip-flops may be implemented. It will be appreciated that in some embodiments, increasing the number of capture flip-flops may increase an accuracy of measurement of how far through the delay chain a clock edge has propagated.

In some embodiments, the detecting circuit 110 may further include a clock gate for gating the clock signal 500 in response to reset signal. The reset signal may be configured to reset the value of the first to fifth (or capture) flip-flops to a first value before a clock edge is introduced into the delay line 200.

It will be appreciated that the delay elements 701, 702, 703, 704, 705 may have substantially even delays in some embodiments. Additionally, while four or five delay elements are given by example, the delay line may include more or less delay elements. In some embodiments, the number of delay elements may correspond to the number of capture flip-flops.

In some embodiments, the delay difference in clocking a first capture flip-flop and a second capture flip-flop may correspond to the threshold time period. It will be appreciated that the reducing circuit may be provided by combinatorial logic. In other embodiments, the reducing circuitry may be omitted, and the comparison of the indications may be carried out by a determining circuit.

That which is claimed is:

1. An apparatus comprising:
   a delay line comprising a plurality of delay elements and configured to have at least one first delay value corresponding to a first operating condition of the apparatus and at least one second delay value corresponding to a second operating condition of the apparatus;
   a monitoring circuit configured to monitor a time taken for a first clock edge of a clock signal to propagate through said delay line and comprising
      a first plurality of flip-flops, an output value of each delay element being configured to clock a respective one of the first plurality of flip-flops,
      each first flip-flop having a data input, and a data output, said data output being coupled in feedback with said data input; and
   a determining circuit configured to determine whether a current operating condition of the apparatus is acceptable based upon the time taken for the first clock edge of the clock signal to propagate through said delay line.

2. The apparatus of claim 1 wherein said determining circuit is configured to determine if the first clock edge has propagated through said delay line within a threshold time period.

3. The apparatus of claim 2 wherein the threshold time period comprises a clock period of the clock signal.

4. The apparatus of claim 1 wherein said determining circuit is configured to determine output values of said plurality of delay elements at the first clock edge and a second clock edge, and compare the output values at the first and second clock edges.

5. The apparatus of claim 4 wherein said determining circuit is configured to determine that the current operating condition of the apparatus is acceptable when the output values of said plurality of delay elements indicate that a clock edge has propagated through said plurality of delay elements.

6. The apparatus of claim 1 wherein said monitoring circuit further comprises a second plurality of flip-flops, each of the second plurality of flip-flops being configured to receive a respective output from each of the first plurality of flip-flops, and be clocked by an undelayed version of the clock signal.

7. The apparatus of claim 6 further comprising a first inverter coupled at an input of at least one of said second plurality of flip-flops, and a second inverter coupled at an output of the at least one of the second plurality of flip-flops.

8. The apparatus of claim 4 wherein said determining circuit comprises a combination circuit configured to provide an indication having a first value when output values of the first plurality of flip-flops are the same and a second value when the output values of the first plurality of flip-flops are different.

9. A system comprising:
   a functional circuit; and
   a detector cooperating with said functional circuit and comprising
      a delay line comprising a plurality of delay elements and configured to have at least one first delay value corresponding to a first operating condition of said functional circuit and at least one second delay value corresponding to a second operating condition of said functional circuit,
      a monitoring circuit configured to monitor a time taken for a first clock edge of a clock signal to propagate through said delay line and comprising
         a first plurality of flip-flops, an output value of each delay element being configured to clock a respective one of the first plurality of flip-flops,
         each first flip-flop having a data input, and a data output, said data output being coupled in feedback with said data input, and
      a determining circuit configured to determine whether a current operating condition of said functional circuit is acceptable based upon the time taken for the first clock edge of the clock signal to propagate through said delay line.

10. The system of claim 9 wherein the operating condition of said functional circuit comprises a speed of operation of said functional circuit.

11. The system of claim 9 wherein said determining circuit is configured to determine if the first clock edge has propagated through said delay line within a threshold time period.

12. The system of claim 11 wherein the threshold time period comprises a clock period of the clock signal.

13. The system of claim 9 wherein said determining circuit is configured to determine output values of said plurality of delay elements at the first clock edge and a second clock edge, and compare the output values at the first and second clock edges.

14. A method for determining a current operating condition of a functional circuit with a detector cooperating with the functional circuit, the method comprising:

transmitting a clock signal through a delay line in the detector, the delay line comprising a plurality of delay elements, a first clock edge of the clock signal being delayed by the delay line by a first delay value under a first operating condition of the functional circuit and by a second delay value under a second operating condition of the functional circuit;

monitoring, via a monitoring circuit in the detector, a time taken for the first clock edge of a clock signal to propagate through the delay line, the monitoring circuit comprising a first plurality of flip-flops, an output value of each delay element being configured to clock a respective one of the first plurality of flip-flops, each first flip-flop having a data input, and a data output, the data output being coupled in feedback with the data input; and determining, via a determining circuit in the detector, whether the current operating condition of the functional circuit is acceptable based upon the time taken for the first clock edge of the clock signal to propagate through the delay line.

15. The method of claim 14 wherein the determining further comprises determining if the first clock edge has propagated through the plurality of delay elements within a threshold time period.

16. The method of claim 15 wherein the threshold time period comprises a clock period of the clock signal.

17. The method of claim 14 further comprising determining output values of the plurality of delay elements at the first clock edge and a second clock edge, and comparing the output values at the first and second clock edges.

18. The method of claims 14 further comprising determining that the current operating condition of the functional circuit is acceptable when output values of the plurality of delay elements indicate that the first clock edge has propagated through the delay elements.

19. The method of claims 14 further comprising determining that the current operating condition of the functional circuit is acceptable when output values of the plurality of delay elements are the same.

20. The method of claim 14 further comprising receiving a respective output from each of the first plurality of flip-flops at each of a second plurality of flip-flops, each second flip-flop being clocked by an undelayed version of the clock signal.

21. The method of claim 20 further comprising inverting an input value and an output value of at least one of the second plurality of flip-flops.

22. The system of claim 9 wherein said monitoring circuit further comprises a second plurality of flip-flops, each of the second plurality of flip-flops being configured to receive a respective output from each of the first plurality of flip-flops, and be clocked by an undelayed version of the clock signal.

* * * * *